United States Patent
Tao et al.

(10) Patent No.: US 8,422,193 B2
(45) Date of Patent: Apr. 16, 2013

(54) ANNULUS CLAMPING AND BACKSIDE GAS COOLED ELECTROSTATIC CHUCK

(75) Inventors: Teng Chao D. Tao, Saugus, MA (US); William D. Lee, Boston, MA (US); Marvin R. LaFontaine, Kingston, NH (US); Ashwin M. Purohit, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 1636 days.

(21) Appl. No.: 11/641,334

(22) Filed: Dec. 19, 2006

(65) Prior Publication Data

US 2008/0144251 A1 Jun. 19, 2008

(51) Int. Cl.
*H01L 21/683* (2006.01)

(52) U.S. Cl.
USPC .......................................................... 361/234

(58) Field of Classification Search .................... 361/234
See application file for complete search history.

(56) References Cited

U.S. PATENT DOCUMENTS

| | | | | |
|---|---|---|---|---|
| 5,754,391 A * | 5/1998 | Bates | ............................. | 361/234 |
| 5,838,528 A * | 11/1998 | Os et al. | ......................... | 361/234 |
| 5,975,536 A | 11/1999 | Helgeland | | |
| 6,108,189 A * | 8/2000 | Weldon et al. | .................. | 361/234 |
| 6,433,346 B1 * | 8/2002 | Hirayanagi | ................. | 250/492.2 |
| 6,552,892 B2 * | 4/2003 | Carroll et al. | .................. | 361/234 |
| 6,629,423 B1 | 10/2003 | Hirooka et al. | | |
| 6,684,652 B2 | 2/2004 | Kim et al. | | |
| 7,033,443 B2 | 4/2006 | Kellerman et al. | | |
| 7,135,691 B2 | 11/2006 | Vanderpot et al. | | |
| 7,323,695 B2 | 1/2008 | Vanderpot et al. | | |
| 7,697,260 B2 | 4/2010 | Brown et al. | | |
| 2003/0161088 A1 * | 8/2003 | Migita | ........................... | 361/234 |
| 2003/0221626 A1 | 12/2003 | Leavitt et al. | | |
| 2005/0219786 A1 * | 10/2005 | Brown et al. | .................. | 361/234 |
| 2006/0171094 A1 * | 8/2006 | Muka et al. | .................... | 361/234 |
| 2007/0109714 A1 * | 5/2007 | Chung | ............................ | 361/234 |
| 2008/0105836 A1 | 5/2008 | Eiriksson et al. | | |
| 2008/0144251 A1 | 6/2008 | Tao et al. | | |
| 2009/0273878 A1 | 11/2009 | Lee et al. | | |
| 2009/0277883 A1 | 11/2009 | Tandou et al. | | |
| 2010/0090413 A1 | 4/2010 | Mahoney et al. | | |
| 2010/0171044 A1 | 7/2010 | Lee et al. | | |
| 2011/0062806 A1 | 3/2011 | Ohashi et al. | | |
| 2011/0291023 A1 | 12/2011 | Lee et al. | | |

OTHER PUBLICATIONS

"Porous Media Technology", New Way Air Bearings, Jan. 30, 2008, reprinted from the Internet at: http://www.newwayairbearings.com/porous-media-technology , 1 page.

(Continued)

*Primary Examiner* — Rexford Barnie
*Assistant Examiner* — Ann Hoang
(74) *Attorney, Agent, or Firm* — Eschweiler & Associates, LLC

(57) ABSTRACT

An electrostatic clamp (ESC), system, and method for clamping a workpiece is provided. A clamping plate of the ESC has central disk and an annulus encircling the central disk, wherein the central disk is recessed from the annulus by a gap distance, therein defining a volume. Backside gas delivery apertures are positioned proximate to an interface between the annulus and the central disk. A first voltage to a first electrode of the annulus clamps a peripheral region of the workpiece to a first layer. A second voltage to a second electrode of the central disk generally compensates for a pressure of a backside gas within the volume. The ESC can be formed of J-R- or Coulombic-type materials. A cooling plate associated with the clamping plate further provides cooling by one or more cooling channels configured to route a cooling fluid therethrough.

25 Claims, 7 Drawing Sheets

OTHER PUBLICATIONS

U.S. Appl. No. 12/725,508, filed Mar. 17, 2010. 28 Pages.
Final Office Action dated Jan. 7, 2013 for U.S. Appl. No. 13/116,661.
Office Action dated Dec. 20, 2012 for U.S. Appl. No. 13/150,822.
Notice of Allowance dated Mar. 6, 2013 for U.S. Appl. No. 13/150,822.

* cited by examiner the desired thermal performance. Thus, in order to maintain proper clamping of the workpiece, forces associated with the higher backside gas pressure should be properly offset with a larger clamping force or voltage applied to the ESC. In cases of high power ion implantations (e.g., 2.5 kW), the gas pressure is substantially high in order to attain proper cooling, wherein the clamping force should be appropriately increased in an attempt to compensate for the substantially high gas pressure. Further, in the case of a two-dimensionally scanned workpiece, such as seen in some ion implantation systems, large G-forces can be present during workpiece oscillation, wherein even higher clamping forces are necessitated in order to maintain sufficient contact between the workpiece and the ESC. However, increasing the clamping force on the entire workpiece can have deleterious effects, such as increased particulate contamination, since the increased clamping pressure can cause frictional forces between the ESC and the workpiece across the surface of the workpiece, thus leading to greater chances of particulate contamination across the areas of the workpiece in which devices are formed.

ANNULUS CLAMPING AND BACKSIDE GAS COOLED ELECTROSTATIC CHUCK

FIELD OF THE INVENTION

The present invention relates generally to semiconductor processing clamping systems, and more specifically to an electrostatic clamp and method of clamping workpieces.

BACKGROUND OF THE INVENTION

Electrostatic clamps or chucks (ESCs) are often utilized in the semiconductor industry for clamping workpieces or substrates during plasma-based or vacuum-based semiconductor processes such as ion implantation, etching, chemical vapor deposition (CVD), etc. Clamping capabilities of the ESCs, as well as workpiece temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., ion implantation), a clamping voltage is typically applied between the wafer and the electrode, wherein the wafer is clamped against the chuck surface by electrostatic forces.

A subset of electrostatic clamps, referred to as Johnsen-Rahbek (J-R) clamps, utilize "leaky" dielectric layers (e.g., semiconductive dielectric layers having bulk resistances of between approximately $1 \times 10^8$ to $1 \times 10^{12}$ Ohm-cm) in contact with the wafer, wherein greater clamping forces can be achieved at lower voltages than with conventional non-J-R clamps. Typically, lower voltage input to the ESC not only reduces power supply requirements associated with the J-R clamps, but further provides a clamping environment that is potentially less destructive to the wafer and devices formed thereon.

A conventional J-R clamp, for example, comprises a dielectric layer that is slightly conductive, thus generally permitting a thickness of the dielectric layer (e.g., a ceramic) to be much thicker than would be permitted for a "classic" or Coulombic ESC. Such an increase in thickness greatly facilitates the clamp manufacturing process, while also reducing clamp operating voltages. For example, the dielectric layer can be used as a base for the formation of positive and negative electrodes by screen printing and firing of a dielectric paste. However, a charge transfer typically resulting from the use of a semiconductor dielectric, for example, can also transmit a charge to the wafer, therein generating residual clamping forces that can result in a delay in releasing the wafer from the clamp. To mitigate the effects of residual clamping forces, A/C clamping voltages utilizing multiple groups of electrodes (e.g., multi-phasing or poly-phasing) can be used. However, such A/C clamping voltages and multiple groups of electrodes typically necessitate that each electrode have its area distributed somewhat evenly across the clamp. The resulting electrode structures can be quite complicated because of the design constraints driven by the need to maximize clamping area and force.

Some conventional ESCs further utilize backside gas cooling in order to cool the workpiece during processing. In such instances, a cooling gas is presented between the workpiece and a surface of the ESC, wherein the pressure of the gas is generally proportional to the heat transfer-coefficient thereof. Thus, in order to attain a higher cooling rate, a higher backside cooling gas pressure is typically needed in order to provide the desired thermal performance. Thus, in order to main- Furthermore, design parameters such as backside cooling gas pressure, process chamber pressure, and desired clamping force are typically tightly coupled, such as in the case of the two-dimensionally scanned ion implantation system, wherein ion transport efficiencies associated with operating pressures and backside cooling gas leakage also come into play. Thus, offsetting the clamping pressure with gas pressure, and vice versa, can be quite difficult in such a tightly coupled system.

Therefore, a need exists in the art for a multiple-electrode clamp that generally de-couples the clamping force needed to clamp the workpiece from the requirements associated with backside gas cooling, wherein particulate contamination can be generally mitigated, while providing the desired temperature uniformity and clamping pressure for efficiently processing the workpiece.

SUMMARY OF THE INVENTION

The present invention overcomes the limitations of the prior art by providing a system, apparatus, and method for clamping workpieces in a semiconductor processing system. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward an electrostatic clamp for clamping a workpiece thereto in semiconductor processing, and method for clamping the workpiece thereto. In accordance with one exemplary aspect of the invention, the electrostatic clamp comprises a clamping plate, wherein the clamping plate comprises an annulus and a central disk, wherein the annulus generally encircles the central disk. The annulus comprises a first layer having a first surface associated therewith, wherein the first surface is configured to contact a peripheral region of a surface of the workpiece. According to one example, the peripheral region of the surface of the workpiece is part of an exclusionary zone, wherein semiconductor devices are generally not formed in the exclusionary zone.

The central disk comprises a second layer having a second surface, wherein the second surface is generally recessed from the first surface, therein generally defining a gap between the second surface and the surface of the workpiece.

The first layer and the second layer can comprise a J-R type material or a Coulombic type material. One or more backside gas delivery apertures in fluid communication with a gas supply are further positioned proximate to an interface between the annulus and the central disk, wherein a backside gas is selectively introduced to a volume defined between the annulus, central disk, and workpiece.

A first electrode is associated with the annulus, wherein the first electrode is electrically connected to a first voltage potential, and a second electrode is associated with the central disk, wherein the second electrode is electrically connected to a second voltage potential. The first electrode and second electrode are electrically isolated from one another and are configured to be independently charged, wherein the first voltage potential is operable to substantially clamp the workpiece to the annulus via a first clamping force, and wherein the second voltage potential is operable to provide a second clamping force to the workpiece, wherein the second clamping force can substantially compensate for forces associated with the backside gas pressure. Furthermore, the annulus is operable to provide a substantial seal between the peripheral region of the workpiece and the ESC, wherein the cooling gas is generally maintained within the volume defined by the annulus, central disk, and workpiece.

According to another exemplary aspect, a cooling plate associated with a backside of the clamping plate is further provided, wherein the cooling plate comprises one or more cooling channels configured to route a cooling fluid therethrough. In one example, the one or more cooling channels comprise a plurality of concentric channels interconnected via a plurality of radial passages. The plurality of concentric channels and plurality of radial passages, for example, are defined in a front surface of the cooling plate that faces a backside of the clamping plate. In another example, one or more radial channels are further defined along a backside surface of the cooling plate, wherein the backside surface of the cooling plate is generally opposite the front surface of the cooling plate. The configuration of the one or more cooling channels provides advantageous cooling to the clamping plate, while generally preventing bubble formation therein.

In accordance with yet another exemplary aspect, a method for clamping a workpiece is provided, wherein a clamping plate, such as the clamping plate described above, is provided. A workpiece is placed on the clamping plate, wherein a peripheral region of the workpiece contacts the first layer, and wherein a volume is generally defined by a gap distance between the second layer and a central region of the workpiece. A backside gas is provided to the volume at a backside gas pressure through the one or more backside gas delivery apertures, wherein the backside gas pressure generally pressurizes the volume between the second layer and the central region of the workpiece. A first voltage potential is applied to the first electrode, therein generally attracting the peripheral region of the workpiece to the first layer with a first force. The first force, for example, is sufficient to maintain a position of the workpiece relative to the electrostatic clamp during a translation of the electrostatic clamp, such as a high frequency two-dimensional translation of the electrostatic clamp in an ion implantation process.

According to the invention, a second voltage potential is applied to the second electrode, wherein the central region of the workpiece is generally attracted to the second layer with a second force. The position of the workpiece relative to the clamping plate is maintained by controlling the first voltage potential, and by controlling the second voltage potential, the second force substantially offsets a force associated with the backside gas pressure within the volume, such that the second force further generally controls the gap distance. Thus, the gap distance is substantially controlled via the control of the second voltage potential, and a heat transfer coefficient within the volume can be further controlled by controlling the backside gas pressure.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
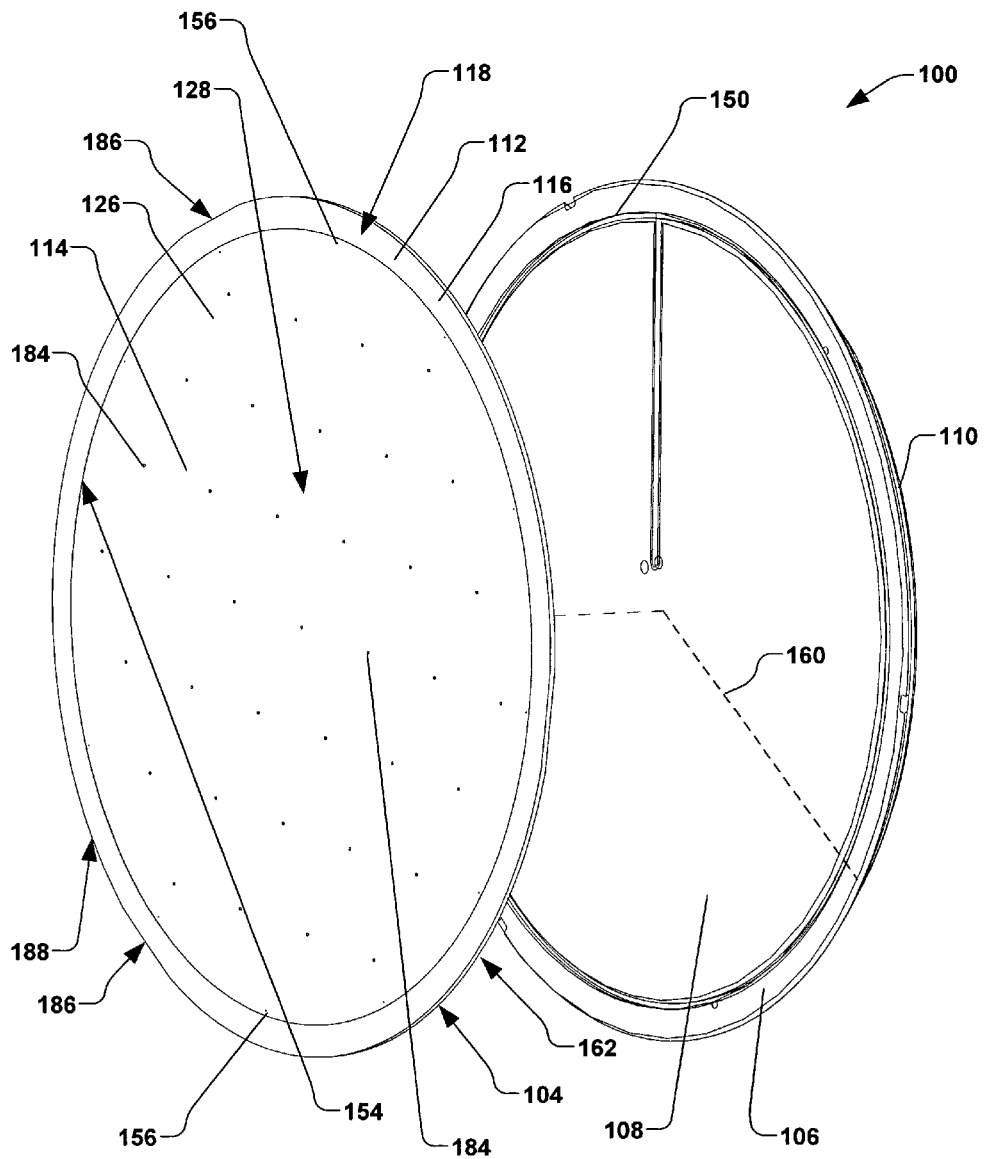
FIG. 1 illustrates an exploded perspective view on an electrostatic chuck according to one exemplary aspect of the present invention.

The present invention is directed generally toward an electrostatic clamp or chuck (ESC) that provides improved clamping and thermal uniformity, while further decreasing backside particle contamination. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates an exploded perspective view of an exemplary electrostatic clamp 100, also referred to as an "ESC". The ESC 100 is operable to substantially clamp a workpiece 102 thereto (illustrated in cross-section in FIG. 2) via electrostatic force during semiconductor processing, such as an ion implantation process, wherein the workpiece is rapidly translated in one or more directions with respect to an ion beam (not shown). The workpiece 102 may comprise a semiconductor substrate, such as a silicon wafer or other substrate. The ESC 100 shown in FIG. 1, for example, comprises a clamping plate 104, a first electrode 106, a second electrode 108, and a cooling plate 110, wherein the clamping plate, first electrode, second electrode, and cooling plate are operably coupled to form the ESC.

Figure 2:
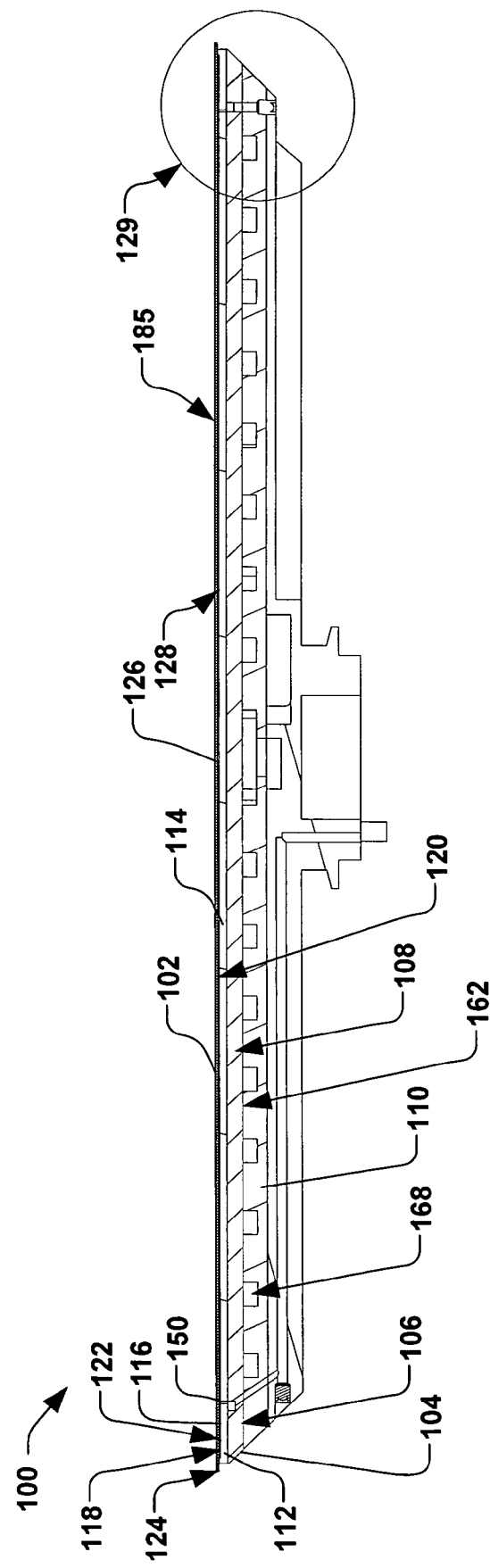
FIG. 2 illustrates a cross-sectional view of the electrostatic chuck of FIG. 1 according to another aspect of the invention.

In accordance with one aspect of the present invention, the clamping plate 104 comprises an annulus 112 and a central disk 114, wherein the annulus generally encircles the central disk. The annulus 112 comprises a first layer 116 having a first surface 118 associated therewith, wherein the first surface is configured to generally contact the workpiece 102, illustrated in cross-section in FIG. 2 As illustrated in FIG. 2, the first surface 118, for example, is operable to contact a surface 120 of the workpiece 102 about a peripheral region 122 thereof during electrostatic clamping. The peripheral region 122 of the surface 120 of the workpiece 102, for example, may be associated with an exclusionary zone 124 of the workpiece, wherein semiconductor devices are generally not formed in the exclusionary zone. The first surface 118 associated with the annulus 112, for example, can partially or entirely contact the surface 102 of the workpiece 102 in the exclusionary zone 124. Alternatively, the first surface 118 can partially or entirely contact an active region 125 of the workpiece, wherein devices (not shown) are formed.

Figure 3:
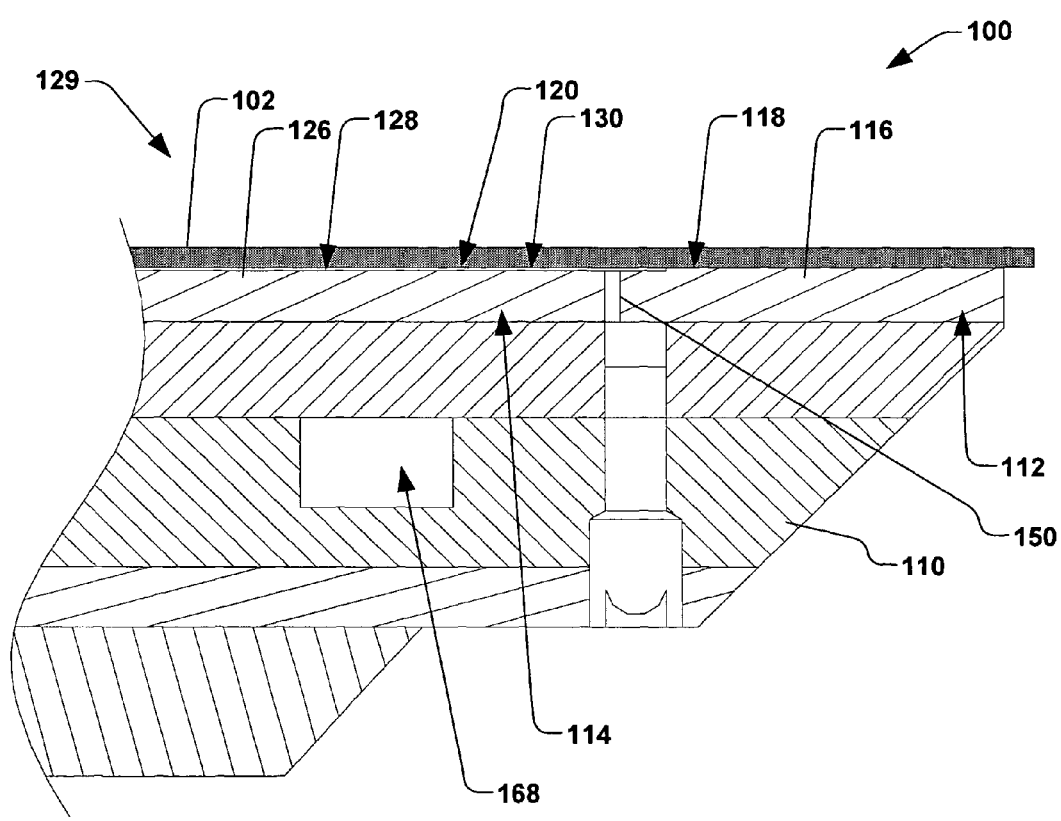
FIG. 3 is a blown-up cross-sectional view of a portion of the electrostatic chuck of FIG. 2.

The central disk 114, for example, comprises having a second layer 126 having a second surface 128 associated therewith. A portion 129 of the exemplary ESC 100 of FIG. 2 is further illustrated in FIG. 3, wherein several inventive aspects of the invention are shown. As illustrated in FIG. 3, the second surface 128 of the second layer 126 is generally recessed from the first surface 118 of the first layer 116 by a predetermined distance, therein generally defining a gap 130 between the second surface and the surface 120 of the workpiece 102. For example, the second surface 128 is generally recessed from the first surface 118 of the first layer 116 by approximately between 5 and 30 microns. In one particular example, the second surface 128 is generally recessed from the first surface 118 of the first layer 116 by approximately 10 microns.

In accordance with another example, the first layer 116 and second layer 126 comprise a doped J-R type material (e.g., alumina doped with titanium, aluminum nitride doped with cerium oxide, or the like). A doped J-R material (e.g., a semiconductive dielectric material having a bulk resistance between $1 \times 10^8$ to $1 \times 10^{12}$ Ohm-cm) has an advantage over non-doped materials in a J-R-type ESC 100 because the clamping plate 104 can be substantially thick (e.g., a thickness of 0.5 mm or more), and does not require subsequent thinning by machining, grinding, or other techniques in order to produce useful clamping forces. Alternatively, the first layer 116 and second layer 126 comprise a non-J-R material, wherein the ESC 100 can be a Coulombic-type clamp.

Figure 4:
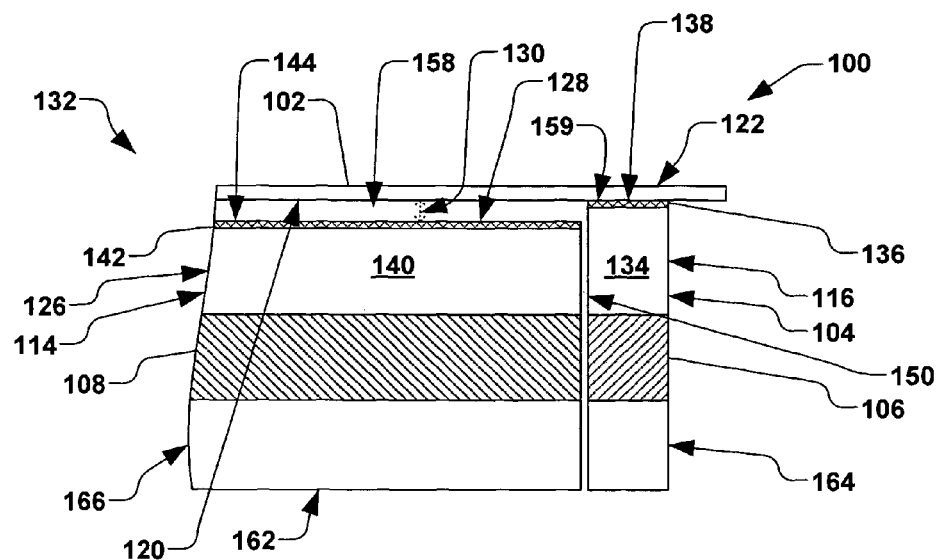
FIG. 4 is a simplified cross-sectional view an exemplary electrostatic chuck according to still another aspect of the present invention.

FIG. 4 illustrates a simplified view 132 of the portion 129 of the exemplary ESC 100 of FIG. 2, wherein several inventive aspects of the present invention are further illustrated. As illustrated in FIG. 4, in accordance with one example, the first layer 116 comprises a first dielectric layer 134 having a first protective layer 136 formed thereon, wherein the first surface 118 is generally defined by a top surface 138 of the first protective layer. In one example, the first dielectric layer 134 comprises a doped dielectric material such as one or more of titania-doped alumina and cerium oxide-doped aluminum nitride. The first protective layer 136, for example, comprises a silicon dioxide ($SiO_2$) layer formed over the first dielectric layer. Alternatively, the first protective layer 136 comprises a polyimide (PI) or other polymer formed over the first dielectric layer 134.

In a similar manner, the second layer 126, for example, comprises a second dielectric layer 140 having a second protective layer 142 formed thereon, wherein the second surface 128 is generally defined by a top surface 144 of the second protective layer. The first dielectric layer 134 and second dielectric layer 140 can be comprised of similar or differing materials. Likewise, the first protective layer 136 and second protective layer 142 can be comprised of similar or differing materials. In one example, the first dielectric layer 134 and second dielectric layer 140 are formed from a common ceramic substrate, wherein the first protective layer 136 and second protective layer 142 are formed over the first and second dielectric layers after the first and second dielectric layers are formed.

In accordance with another aspect of the invention, the first electrode 106 the ESC 100 illustrated in FIG. 2 is associated with the annulus 104, and the second electrode 108 is associated with the central disk 114, wherein the first electrode and second electrode are generally electrically isolated from one another. One or more of the first electrode 106 and second electrode 108, for example, are comprised of one or more of silver, gold, titanium, tungsten, or other electrically conductive metal or material. The first electrode 106 and the second electrode 108 of the ESC 100 can be respectively electrically connected to a respective first voltage source 146 (e.g., a first voltage potential) and second voltage source 148 (e.g., a second voltage potential), as illustrated in FIG. 5, and as will be discussed infra.

Figure 5:
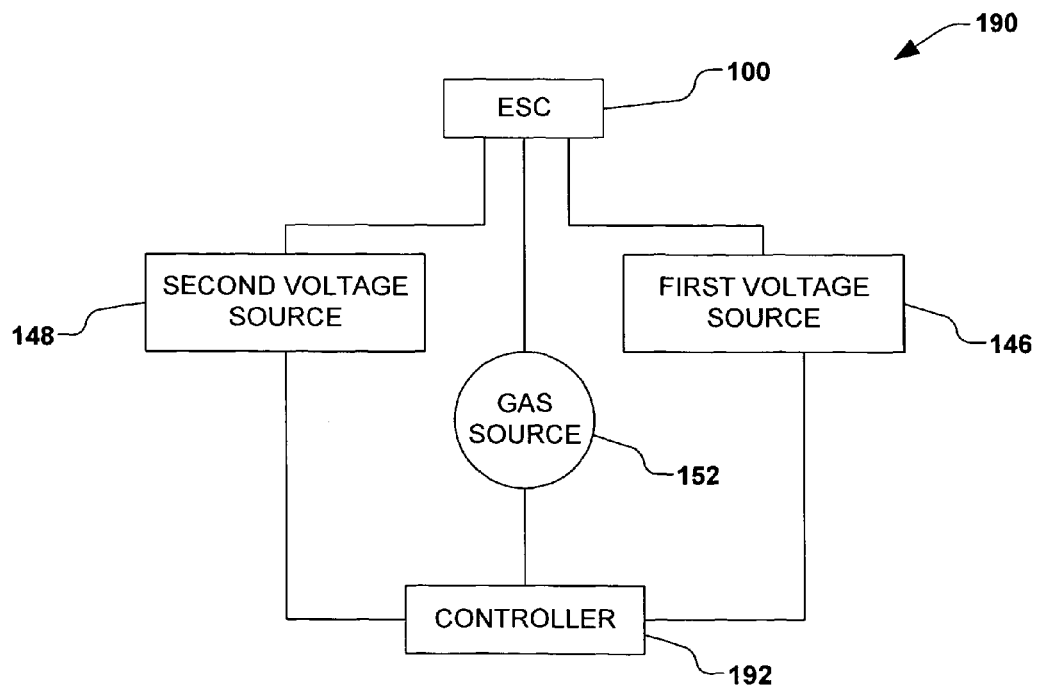
FIG. 5 is a block diagram of an exemplary system comprising the electrostatic chuck of the present invention.

In accordance with another aspect, as illustrated in FIGS. 2-4, the clamping plate 104 further comprises comprise one or more backside gas delivery apertures 150, wherein the one or more backside gas delivery apertures are in fluid communication with a gas source 152, as again illustrated in FIG. 5. The one or more backside gas delivery apertures 150 of FIGS. 2-4, for example, are generally positioned proximate to an interface 154 between the annulus 112 and the central disk 114. For example, the one or more backside gas delivery apertures 150 may comprise one or more holes 156 disposed about the interface 154 between the annulus 112 and the central disk 114, as illustrated in FIG. 1, wherein cooling gas (not shown) is allowed to leak into a volume 158 defined by the gap 130 between the workpiece 102 and the central disk 114, and the annulus 112, as illustrated in FIG. 4. The annulus 112 is thus operable to provide a substantial seal 159 between the peripheral region 122 of the surface 120 of the workpiece 102 and the ESC 100, wherein the cooling gas is generally maintained within the volume 158 defined by the annulus, the central disk 114, and workpiece. By controlling a pressure of the cooling gas, a transfer of heat between the workpiece and the ESC 100 can be controlled, depending on the size of the gap 130, the gas pressure, and whether the gas is in the free molecular regime, transition regime, or viscous flow regime.

The one or more holes 156, in one example, have a diameter of approximately 2 millimeters microns or less, however, various other sized holes are also contemplated as falling within the scope of the present invention. For example, the one or more holes 156 can have a diameter of approximately 500 microns. In one alternative, the one or more backside gas delivery apertures 150 comprise one or more elongate slits (not shown), wherein the one or more slits generally extend a predetermined distance (not shown) along the interface 154 between the annulus 112 and the central disk 114. For example, the one or more elongate slits may comprise linear or arcuate slits, wherein a radial width of the one or more arcuate slits, as measured as extending along a radius 160 of the ESC 100, can be approximately 2 millimeters microns or less when measured between the annulus and the central disk. A length of the one or more elongate slits, for example, can be substantially larger than the radial width thereof.

In accordance with yet another exemplary aspect of the invention, the cooling plate 110 of the ESC 100 of FIGS. 1-4 is associated with a backside 162 of the clamping plate 104, as illustrated in FIG. 4, wherein the clamping plate 104 further comprises a first insulating layer 164 formed between the first electrode 146 and the cooling plate 110, and a second insulating layer 166 formed between the second electrode 148 and the cooling plate. One or more of the first insulating layer 162 and second insulating layer 166, for example, is comprised of a dielectric material, wherein the dielectric material can comprise of one or more of alumina, aluminum nitride, or other insulating material.

Figure 6:
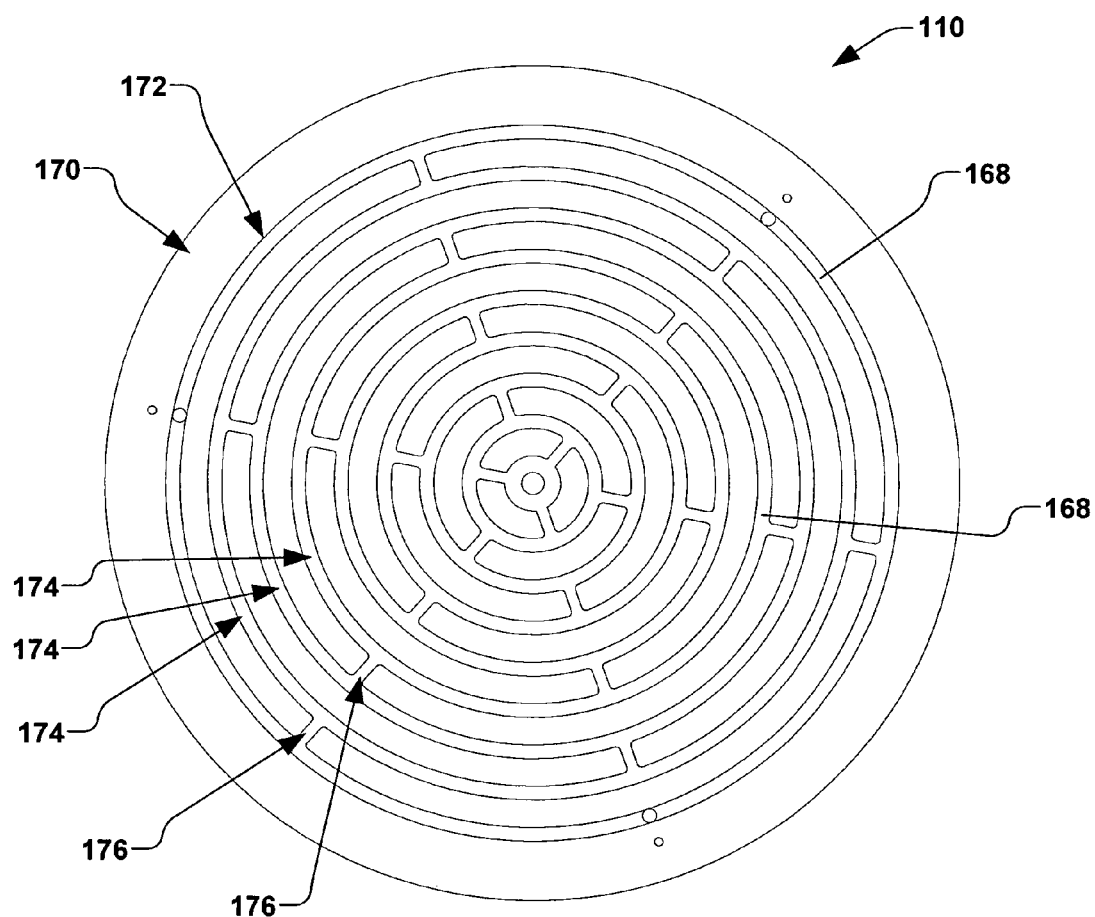
FIG. 6 illustrates a top plan view of an exemplary cooling plate according to yet another aspect of the present invention.

The cooling plate 110, in accordance with another exemplary aspect of the present invention, comprises one or more cooling channels 168, as illustrated in FIGS. 2 and 3. The one or more cooling channels 168, for example, are configured to route a cooling fluid (not shown) such as water, between the clamping plate 104 and the cooling plate 110 and/or through the cooling plate for cooling of the ESC 100 during semiconductor processing. FIG. 6 illustrates an exemplary front surface 170 of the cooling plate 110, wherein the front surface of the cooling plate generally interfaces with the backside 162 of the clamping plate 104 of FIG. 2, for example, wherein a predetermined pattern 172 of at least part of the cooling channels 168 is illustrated. It should be noted that the predetermined pattern 172 can differ from that illustrated in the figures, and all such patterns are contemplated as falling within the scope of the present invention.

Figure 7:
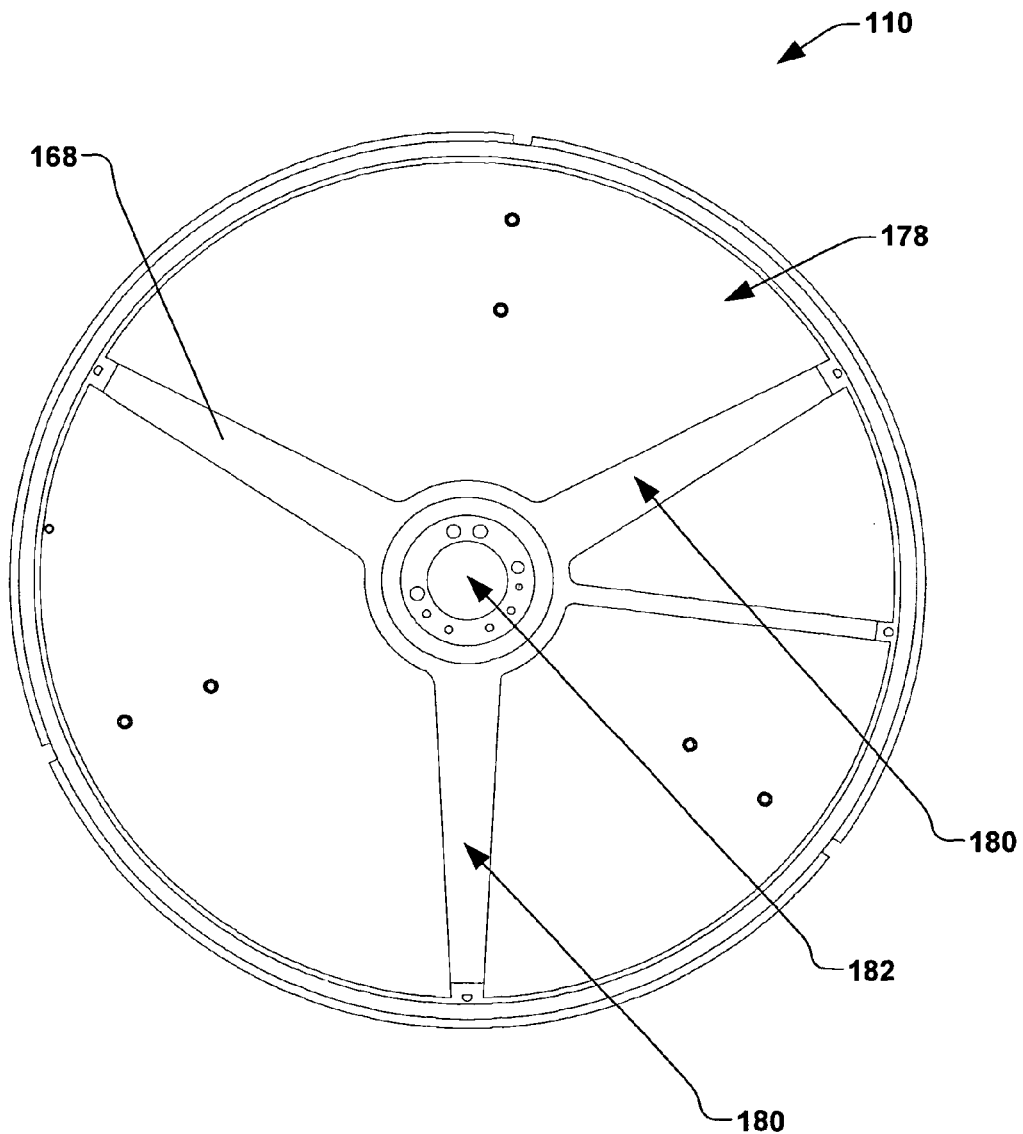
FIG. 7 is a bottom plan view of the exemplary cooling plate of FIG. 6 according to another aspect of the present invention.

As illustrated in FIG. 6, the one or more cooling channels 168 associated with the front surface 170 of the cooling plate 110 comprise a plurality of generally concentric channels 174 that are generally interconnected via a plurality of radial passages 176. FIG. 7 illustrates a backside surface 178 of the exemplary cooling plate 110 of FIG. 6, wherein the backside surface of the cooling plate is generally opposite the front surface of the cooling plate. Accordingly, the one or more channels 168 of the cooling plate 110 further comprise one or more radial channels 180 defined along the backside surface of the cooling plate, wherein the cooling fluid is operable to transfer between the front surface 170 of the cooling plate and the backside surface 178 via one or more holes 182 through the cooling plate. The exemplary plurality of concentric channels 174, radial passages 176, radial channels 180, and one or more holes 182, for example, generally provide an advantageous flow of cooling fluid therethrough, wherein air bubbles are generally minimized.

The exemplary ESC 100 of FIGS. 1-4 of the present invention thus provides cooling of the workpiece 102 and an advantageous clamping around the peripheral region 122 of the workpiece 102 while generally permitting an equilibrium of forces to be obtained between electrostatic forces associated with the central disk 114 and backside gas pressure associated with the volume 158 between the workpiece and the central disk. In accordance with another exemplary aspect of the invention, the second layer 126 can further comprise one or more "micro-dots" or mesas 184, as illustrated in FIG. 1, wherein the one or more mesas generally extend outwardly from the second surface 128 and are configured to contact the surface 120 of the workpiece 102, as illustrated in FIG. 2, in order to generally support an interior region 185 of the workpiece. The one or more mesas 184 illustrated in FIG. 1, for example, have a surface area that contacts approximately 1% or less of the surface 120 of the workpiece 102. Each of the one or more mesas 184, for example, have a surface area of less than 2 mm$^2$, and are generally spaced approximately 15 mm to 30 mm from one another. It should be noted that the one or more mesas 184 may be omitted altogether, wherein the only contract between the ESC 100 and the workpiece 102 is along the annulus 112.

In accordance with still another exemplary aspect of the invention, the clamping plate 104 further comprises a plurality (e.g., three or more) notches 186 disposed about a periphery 188 thereof, wherein the plurality of notches are configured to interface with a gripper (not shown) for handling of the ESC 100. The gripper, for example, can be electrically grounded, wherein a ground pin (not shown) associated therewith generally provides three or more respective electrical grounds associated with the clamping plate. In such a configuration, the plurality of notches 186, for example, thus generally ground the ESC 100, wherein the ESC can be further utilized as mono-pole chuck. The location of the plurality of notches 186 about the periphery 188 of the clamping plate 104, for example, can generally reduce thermal non-uniformities that may be caused by the ground pins. Alternatively, the ESC 100 can be utilized as bi-polar chuck, wherein electrical connections to a ground pin may not be necessary.

FIG. 5 illustrates an exemplary electrostatic clamping system 190, wherein the ESC 100 is operably coupled to the first voltage source or potential 146 (e.g., a first power supply), the second voltage source or potential 148 (e.g., a second power supply), the gas source 152, and a controller 192. For example, the controller 192 is operable to control the first voltage potential 146 applied to the annulus 112 of FIG. 2, in order to generally clamp the workpiece 102 to the ESC 100 and to seal the backside gas within the volume 158 defined between the central disk 114, annulus 112, and workpiece 102, while further controlling the second voltage potential 148 and gas source 152 in order to provide a substantial equilibrium of forces between the electrostatic clamping associated with the second electrode 108 and the pressure of the backside gas within the volume.

Figure 8:
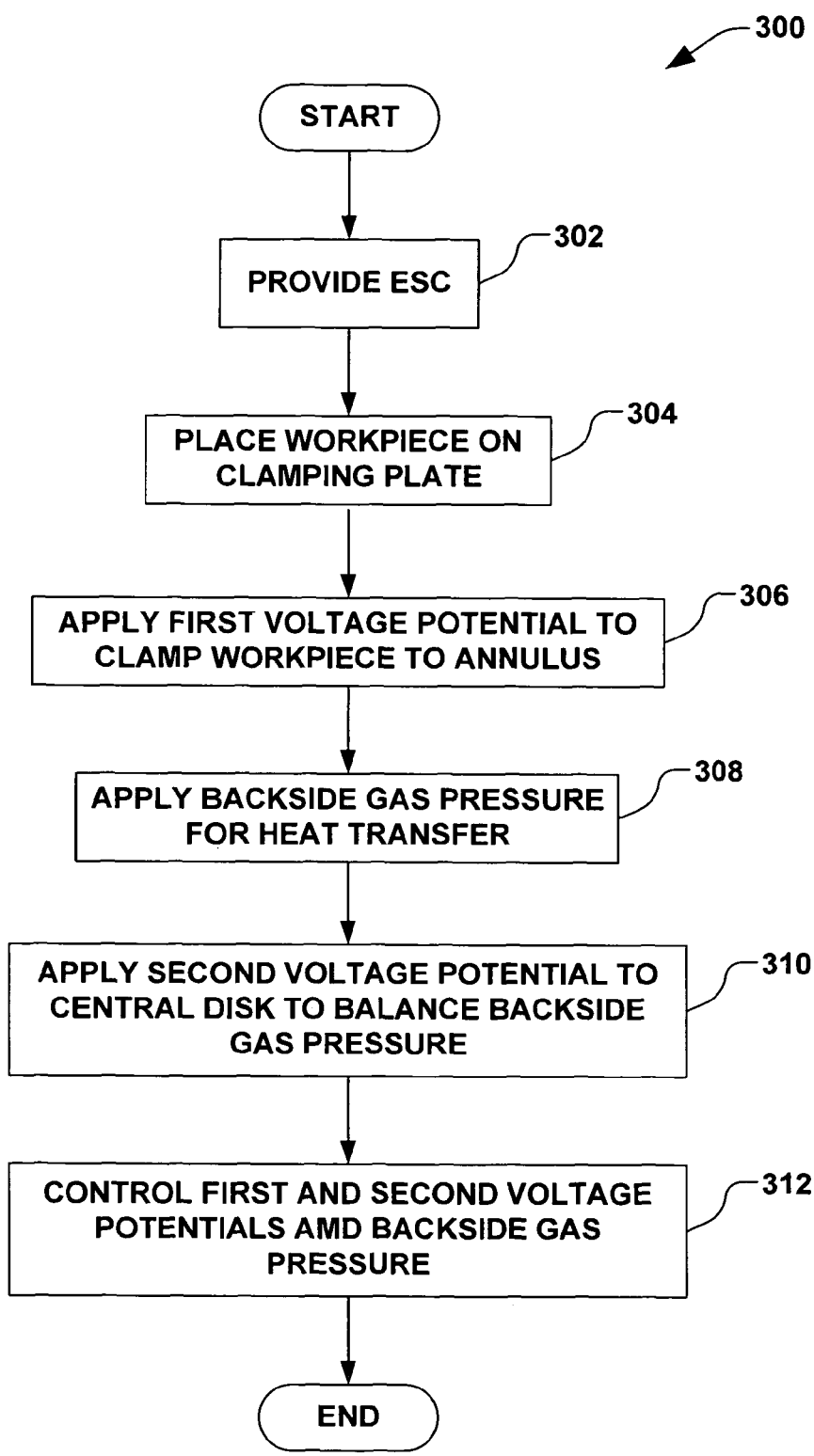
FIG. 8 is a block diagram illustrating an exemplary method for clamping a workpiece in accordance with the present invention.

In accordance with another aspect of the present invention, FIG. 8 illustrates an exemplary method 300 for clamping a workpiece via an electrostatic chuck. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 8, the method 300 begins with act 302, wherein an electrostatic chuck, such as the ESC 100 of FIGS. 1-4 is provided. The ESC that is provided in act 302, for example, comprises a clamping plate, wherein the clamping plate comprises an annulus having a first electrode and a first layer associated therewith. The clamping plate further comprises a central disk having a second electrode and a second layer associated therewith, wherein the central disk is generally recessed from the annulus. The clamping plate still further comprises one or more backside gas delivery apertures positioned proximate to an interface between the annulus and the central disk.

In act 304, a workpiece is placed on the clamping plate, wherein a peripheral region of the workpiece contacts the first layer, and wherein a volume is generally defined by the annulus and a gap distance between the second layer and a central region of the workpiece. In act 306, a first voltage potential is applied to the first electrode, therein generally attracting the peripheral region of the workpiece to the first layer with a first force (e.g., a first clamping force). A backside gas is provided at a backside gas pressure in act 308 to the one or more backside gas delivery apertures, wherein the backside gas pressure generally pressurizes the volume between the second layer and the central region of the workpiece. The backside gas pressure generally determines an amount of heat transfer between the workpiece and the clamping plate. Furthermore, the first force associated with the first voltage potential applied to the first electrode in act 306, for example, is sufficient to generally maintain a position of the workpiece with respect to the clamping plate, and to provide a substantial seal between the workpiece and the annulus to prevent leakage of the backside gas from the volume associated with the ESC.

In act 310, a second voltage potential is applied to the second electrode, therein generally attracting the central region of the workpiece to the second layer with a second force (e.g., a second clamping force). In act 312, the first voltage potential and second voltage potential are controlled, wherein the first voltage potential generally clamps the workpiece to the clamping plate with the first force, and wherein the second voltage potential generally compensates for the backside gas pressure with the second force and generally controls the gap distance. Act 312 can further comprise controlling the backside gas pressure, wherein the backside gas pressure generally determines a transfer of heat between the clamping plate and the workpiece. Thus, the gap distance and backside gas pressure associated with the central disk can be controlled independently of the desired clamping associated with the annulus, therein generally de-coupling the clamping of the central region of the workpiece from the clamping of the peripheral region of the workpiece. Accordingly, in one example, the second force can be substantially less than the first force, wherein such a lower second force can lead to decreased particulate contamination due to decreased friction between the ESC and the central portion of the workpiece.

Accordingly, by de-coupling the clamping as described above, the present invention provides an electrostatic chuck that provides improved thermal uniformities while further decreasing particulate contamination. Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An electrostatic clamp for clamping a workpiece, the electrostatic clamp comprising:
   a clamping plate, comprising:
      an annulus comprising a first layer having a first surface associated therewith, wherein the first surface is configured to contact a peripheral region of a surface of the workpiece;
      a central disk comprising a second layer having a second surface, wherein the annulus generally encircles the central disk, and wherein the second surface is generally recessed from the first surface, therein generally defining a gap between the second surface and the surface of the workpiece; and
      one or more backside gas delivery apertures in fluid communication with a gas supply and positioned proximate to an interface between the annulus and the central disk;
   a first electrode associated with the annulus, wherein the first electrode is electrically connected to a first voltage potential; and
   a second electrode associated with the central disk, wherein the second electrode is electrically connected to a second voltage potential, and wherein the first electrode and second electrode are electrically isolated from one another.

2. The electrostatic clamp of claim 1, wherein the first layer and second layer comprise a J-R type material.

3. The electrostatic clamp of claim 1, wherein the first layer comprises a first dielectric layer having a first protective layer formed thereon, wherein a surface of the first protective layer generally defines the first surface, and wherein the second layer comprises a second dielectric layer having a second protective layer formed thereon, wherein a surface of the second protective layer generally defines the second surface.

4. The electrostatic clamp of claim 3, wherein one or more of the first dielectric layer and second dielectric layer comprises a doped dielectric material.

5. The electrostatic clamp of claim 1, wherein the second surface is recessed from the first surface by between approximately 5 and 30 microns.

6. The electrostatic clamp of claim 5, wherein the second surface is recessed from the first surface by approximately 10 microns.

7. The electrostatic clamp of claim 1, wherein one or more of the first electrode and second electrode comprise an electrically conductive metal.

8. The electrostatic clamp of claim 1, wherein the peripheral region of the surface of the workpiece is associated with an exclusionary zone of the workpiece, wherein no semiconductor devices are formed in the exclusionary zone.

9. The electrostatic clamp of claim 1, wherein the one or more backside gas delivery apertures comprise one or more holes having a diameter of approximately 2 millimeters or less.

10. The electrostatic clamp of claim 1, wherein one or more backside gas delivery apertures comprise one or more elongate slits extending along the interface between the annulus and the central disk.

11. The electrostatic clamp of claim 10, wherein a width of the one or more elongate slits is approximately 2 millimeters or less when measured between the annulus and the central disk.

12. The electrostatic clamp of claim 1, further comprising a cooling plate associated with a backside of the clamping plate, wherein the cooling plate comprises one or more cooling channels configured to route a cooling fluid therethrough.

13. The electrostatic clamp of claim 12, wherein the one or more channels of the cooling plate comprise a plurality of concentric channels interconnected by a plurality of radial passages, wherein the plurality of concentric channels and plurality of radial passages are defined in a front surface of the cooling plate that faces the backside of the clamping plate.

14. The electrostatic clamp of claim 13, wherein the one or more channels of the cooling plate further comprise one or more radial channels defined along a backside surface of the cooling plate, wherein the backside surface of the cooling plate is generally opposite the front surface of the cooling plate.

15. The electrostatic clamp of claim 12, further comprising a first insulating layer formed between the first electrode and the cooling plate, and a second insulating layer formed between the second electrode and the cooling plate.

16. The electrostatic clamp of claim 1, wherein the second layer further comprises one or more mesas, wherein the one or more mesas generally extend outwardly from the second surface and contact the surface of the workpiece.

17. The electrostatic clamp of claim 16, wherein the one or more mesas have a surface area that contacts approximately 1% or less of the surface of the workpiece.

18. The electrostatic clamp of claim 16, wherein each of the one or more mesas have a surface area of less than 2 mm$^2$.

19. The electrostatic clamp of claim 1, wherein the clamping plate further comprises three or more notches disposed about a periphery thereof, wherein the three or more notches are configured to interface with a grounded gripper, therein providing three or more respective electrical grounds associated with the clamping plate.

20. A method for clamping a workpiece, the method comprising:
   providing a clamping plate, wherein the clamping plate comprises an annulus having a first electrode and a first layer associated therewith, a central disk having a second electrode and a second layer associated therewith, wherein the central disk is generally recessed from the annulus, and wherein the clamping plate further comprises one or more backside gas delivery apertures positioned proximate to an interface between the annulus and the central disk;
   placing the workpiece on the clamping plate, wherein a peripheral region of the workpiece contacts the first layer, and wherein a volume is generally defined by a gap distance between the second layer and a central region of the workpiece;
   applying a first voltage potential to the first electrode, therein generally attracting the peripheral region of the workpiece to the first layer with a first force;
   providing a backside gas at a backside gas pressure to the one or more backside gas delivery apertures, wherein the backside gas pressure generally pressurizes the volume between the second layer and the central region of the workpiece;
   applying a second voltage potential to the second electrode, therein generally attracting the central region of the workpiece to the second layer with a second force; and
   controlling the first voltage potential and second voltage potential, wherein the first voltage potential generally clamps the workpiece to the clamping plate via the first force, and wherein the second voltage potential generally compensates for the backside gas pressure via the second force, therein generally controlling the gap distance.

21. The method of claim 20, further comprising controlling the backside gas pressure, wherein the backside gas pressure generally determines a transfer of heat between the clamping plate and the workpiece.

22. The method of claim 20, further comprising cooling a backside of the clamping plate via a cooling plate, wherein cooling fluid is flowed through one or more cooling channels associated with the cooling plate.

23. The method of claim 20, wherein the first voltage potential and second voltage potential are alternating current voltages.

24. The method of claim 20, wherein the first voltage potential and second voltage potential are direct current voltages.

25. The method of claim 20, wherein applying the first voltage potential to the first electrode generally provides a seal between the annulus and the workpiece, therein generally maintaining the backside gas within the volume.

* * * * *